United States Patent
Nanya

[11] 4,016,539
[45] Apr. 5, 1977

[54] ASYNCHRONOUS ARBITER

[75] Inventor: Takashi Nanya, Tokyo, Japan

[73] Assignee: Nippon Electric Company, Ltd., Tokyo, Japan

[22] Filed: Sept. 10, 1974

[21] Appl. No.: 504,788

[30] Foreign Application Priority Data

Sept. 12, 1973 Japan .................. 48-103448
Sept. 12, 1973 Japan .................. 48-103451

[52] U.S. Cl. .................. 340/147 LP; 340/147 R
[51] Int. Cl.² .................. H04Q 9/00
[58] Field of Search ...... 340/147 LP, 152, 147 CN; 179/15 BA; 307/232; 328/99, 109, 137, 152; 178/50, 58, 66

[56] References Cited
UNITED STATES PATENTS

| | | | |
|---|---|---|---|
| 3,300,758 | 1/1967 | Hawley | 340/147 LP |
| 3,639,904 | 2/1972 | Arulpragasam | 340/147 LP |
| 3,665,398 | 5/1972 | Kawai | 340/147 LP |

Primary Examiner—Harold I. Pitts
Attorney, Agent, or Firm—Sughrue, Rothwell, Mion, Zinn & Macpeak

[57] ABSTRACT

An asynchronous arbiter for use in systems where two or more signal sources attempt to simultaneously use a resource operates to insure that signal source requests are honored in the sequence of the earliest generated request to the latest generated request. The arbiter preserves the order of requests while the respective request signals are kept waiting, and an acknowledgement signal for use of the resource is given in succession to the respective signal sources starting from the signal source with the earliest request to successively service the requests of the signal sources. The arbiter is implemented with a competition decision circuit receiving as inputs a plurality of request signals from respective signal sources and providing an output to a control circuit designating the signal source to be serviced. The control circuit also receives an acknowledgement input from the resource indicating that a request is acceptable, and from these inputs generates a request signal to the resource and an acknowledgement signal to the signal processors in order of priority.

2 Claims, 4 Drawing Figures

ASYNCHRONOUS ARBITER

BACKGROUND OF THE INVENTION

1. Field of the Invention

The present invention relates to an asynchronous arbiter, and more particularly, to an asynchronous arbiter capable of such a function that in the case where a plurality of request signals are so asynchronously generated as to vie with each other from a plurality of mutually independent signal sources towards a common resource, the respective request signals are transmitted in succession to the resource in the order of their generation by giving the highest priority to the request signal generated earliest, and an acknowledgement signal from the resource is sent to the signal source having the highest priority and thereafter to the remaining signal sources in descending order of priority.

2. Description of the Prior Art

In a parallel information processing system, a plurality of processors operating quite independently of each other may share a common resource such as a memory, a data bus, an I/O device or an arithmetic unit. Consequently, at various times during system operation there occurs a situation where request signals for the use of the common resource by two or more processors are generated in overlapping time periods, and as a result, these request signals conflict with each other.

As a specific example, in recent large-sized and highly-improved parallel information processing systems, this situation often occurs, and therefore, in order to enhance the efficiency of the system, the problem of resource allocation becomes most important. Generally, in a parallel information processing system in which no particular order of the priority is predetermined for the respective processors and in which they are serviced on an equal preference basis, the earlier generation of the request signal from each processor becomes a basis for the resource allocation. More particularly, among the processors from which a plurality of requests for using a resource are generated, the first use is acknowledged for the processor generating the earliest request signal, while the other processors are left waiting, and thereafter, when the use of the resource by the first acknowledged processor has been finished, and when the request signal has disappeared, the resource use by the processor producing the second earliest request signal and kept waiting up to that moment is acknowledged. However, in such an informaion processing system, the respective request signals always vie asynchronously, and as a result, this situation may cause considerable difficulty in the system operation. Therefore, it is considered that the realization of a simple asynchronous arbiter capable of dealing with such conflicts between the request signals will greatly contribute to the enhancement of the reliability and the improvement of the efficiency of the system.

As will be apparent from the above-described background of the art, the use and the application of such an asynchronous arbiter is very wide, or, in other words, the arbiter is applicable to any situation where conflicts may occur between the asynchronous signals in not only computer systems, but also in communication systems in general. For instance, the switching of telephone lines, the interface control in a computer network, the page swapping in a virtual memory system and the data bus control in a multiprocessing system, etc., are all fields wherein an asynchronous arbiter can be used.

However, conventional asynchronous arbiters have disadvantages such that the number of needed elements is typically large because the circuit construction is complicated and that the resource allocation cannot always be done in the order of the generation of the request signals. For instance, one of the conventional asynchronous arbiters is disclosed in a paper entitled "Asynchronous Arbiters" by William W, Plummer and published in *IEEE Transactions On Computers*, Vol. C-21, No. 1, Pages 37–42, and its circuit construction is illustrated in FIG. 11 on Page 41 of that reference. In the conventional arbiter as shown therein, when request signals ($R_1$ and $R_2$) are so generated from a plurality of processors as to vie with each other, an input gate is closed by an AWAIT signal produced as a logical sum of the signals representing the generation of the request signals, resulting in blocking of the subsequent request signals, so that while the request signal generated earliest is occupying a resource, the second and subsequent orders of the preference in vying cannot be held. Accordingly, the basic principle of the successive acknowledgement for resource use in sequence starting from the request signal generated earliest is not always maintained. In other words, such a conventional arbiter as that disclosed by Plummer has a disadvantage such that among the orders of the preference in vying of the request signals, the second and subsequent orders of the preference will disappear. Also, at the time point where said input gate has been closed, the candidates that can be a winner in the competition generally consist of a plurality of the request signals ($R_1$ and $R_2$), and among these candidates, the earliest winner must be decided according to a predetermined order of preference by means of a flip-flop 2LAST. As a result, this conventional asynchronous arbiter also has disadvantages such that the operation speed becomes low, and that a lot of logic elements are needed.

SUMMARY OF THE INVENTION

It is, therefore, one object of the present invention to provide an asynchronous arbiter free from the above-mentioned disadvantages associated with the asynchronous arbiters in the prior art.

Another object of the present invention is to provide an asynchronous arbiter constructed in a very simple manner and capable of such a function that in a case where a plurality of request signals from a plurality of signal sources are so asynchronously generated as to vie with each other, the respective request signals are kept waiting while preserving the orders of preference in vying, and an acknowledgement signal for use of the resource is given in succession to the respective signal sources starting from the signal source with the earliest request to successively service the requests of the signal sources.

As asynchronous arbiter of the present invention comprises an input group including a plurality of input terminals connected to receive request signals from a plurality of signal sources; an output group including a plurality of output terminals connected to provide in succession an acknowledgement signal to the plurality of signal sources; another input terminal for receiving the acknowledgement signal from the resource, and another output terminal for delivering a request signal to the resource; a competition decision circuit functioning in such a manner that when all of the inut terminals in the input group take a first signal value of a binary signal, every one of a plurality of decision output terminals equal in number to the input terminals of the input group and having one-to-one correspondence thereto is set at a usual signal value that is arbitrarily determined among first and second signal values, while when a part of all of the input group take a second signal value, only one decision output terminal corresponding to the input terminal turned from the first signal value to the second signal value earliest among the input terminals taking the second signal value changes to an unusual signal value different from the usual value, and also, the order of the occurrence of the changes from the first signal value to the second signal value of the respective input terminals of the input group is preserved; and a control circuit functioning in such a manner that in accordance with any arbitrary one of the decision output terminas in the decision circuit turned from the usual value to the unusual value, a signal value at said another output terminal changes either immediately or after an appropriate delay, and when a signal value at said another input terminal changes in response to the signal change at said another output terminal, a signal value at a particular output terminal in the output group determined with reference to the states of the decision output terminals in the decision circuit changes in accordance with the signal change at said another input terminal; whereby among a plurality of signals so asynchronously generated from a plurality of mutually independent binary signal sources as to vie with each other, a signal generated earliest is given the highest preference for transmitting the respective signals in succession to the resource, and a response signal from the resource can be returned to the corresponding signal source.

BRIEF DESCRIPTION OF THE DRAWINGS

The present invention will now be described in greater detail in conjunction with the accompanying drawings, in which.

DESCRIPTION OF THE PREFERRED EMBODIMENT

Though the present invention will be described more in detail with reference to the accompanying drawings, throughout the description hereinunder, for the convenience of explanation, first and second signal values of a binary signal will be simply represented by 0 and 1, respectively.

Figure 1:
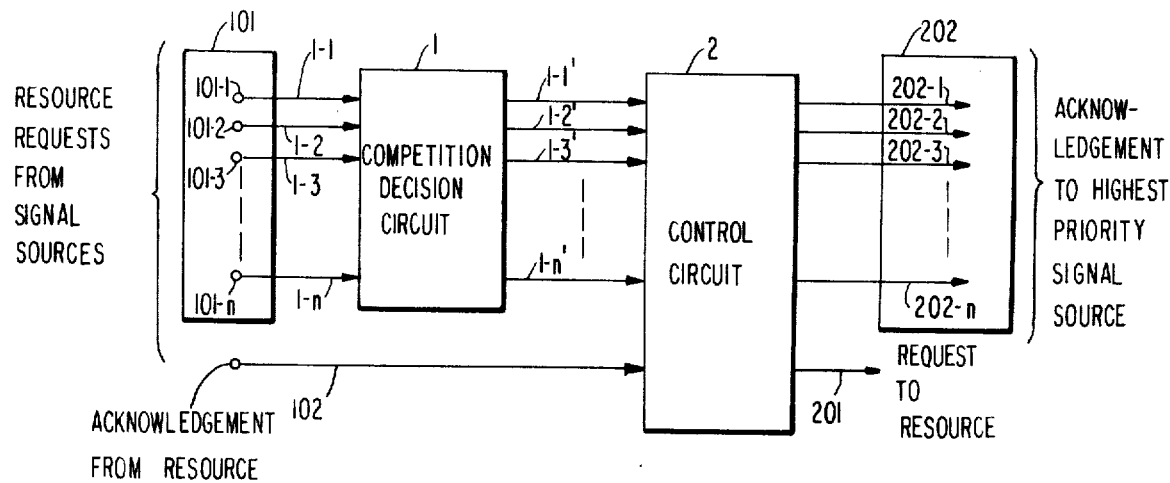
FIG. 1 shows a block diagram of one embodiment of the present invention.

In FIG. 1, a reference numeral 101 represents an input group consisting of n input terminals 101-1, 101-2, ..., and 101-n. This input group 101 is adapted to receive request signals from n mutually independent processors (not shown) or signal sources (not shown). Each input terminal is 0 when a request for use of a resource from the corresponding processor is absent, but it becomes a 1 when the request occurs. A competition decision circuit 1 is provided with $n$ decision input terminals 1-1, 1-2, ..., and 1-n, and n decision output terminals 1-1', 1-2', ..., and 1-n' corresponding to the respective decision input terminals in one-to-one correspondence. If all of the $n$ input terminals of the decision circuit 1 are 0, every one of the $n$ decision output terminals is set at 0, but if some of the decision input terminals are 1, only one decision output terminal becomes a 1 corresponding to the decision input terminal turnred from 0 to 1 earliest among the decision input terminals that are 1. In other words, the competition decision circuit 1 functions is such a manner that when requests have occurred from a number of processors and when the corresponding decision input terminals have been turned to 1, the processor generating the request earliest among the processors with the requests causes the corresponding decision output terminal to be 1 and also suppresses the input signals corresponding to the processors generating the request secondly and subsequently. However, it is to be noted that the order of the generation of the second and subsequent requests is never cancelled according to the operation of the invention. More specifically, if the request of the first accepted processor disappears resulting in the corresponding decision input terminal being turned to 0 again, the processor generating the request secondly is designated by the fact that only the decision output terminal corresponding to the input terminal with the earliest request among the input terminals that are still maintained at 1, that is, corresponding to the second earliest input terminal to be turned to 1 changes from 0 to 1. With regard to the processors generating the requests thirdly and subsequently, such a designation is similarly made through the same operation process as that described above.

A control circuit 2 transmits via output terminal 201 the request signal of the processor designated by the decision circuit 1 to a resource (not shown) which is the object of the request in this case, and also, transmits via one of output terminals 202-1, 202-2, ..., and 202-n an acknowledgement signal produced from the resource for representing its acceptance of the request to the processor designated by the decision circuit 1.

Now, for explaining the operation of the control circuit 2 more in detail, n processors (not shown) connected to the input group 101 are represented by $P_1$, $P_2$, ..., and $P_n$, and it is assumed here that requests are generated from three processors in the order of $P_1$, $P_2$, and $P_3$. For this reason, among the decision output terminals of the competition decision circuit 1, a first the decision output terminal 1-1' corresponding to the processor $P_1$ becomes 1 and every other decision terminal is kept 0. Another output terminal 201 is provided to send a request given from every processor to a resource, and so long as another input terminal 102 is 0, the output terminal 201 changes from 0 to 1 following any decision output terminal 1-1', 1-2', ..., and 1-n' turning from 0 to 1 among the decision output terminals of the decision circuit 1. Therefore, in the above-assumed example, as soon as the decision output terminal 1-1' of the decision circuit 1 corresponding to the processor $P_1$ goes from 0 to 1, the output terminal 201 also changes form 0 to 1, immediately. Thus, the request signal produced from the processor $P_1$ has been transmitted to the resource. The input terminal 102 receives an acknowledgement signal for informing the processor generating the request the fact that its request signal has been accepted by the resource, and the input terminal 102 is normally 0 but it changes to 1 when the acknowledgement signal is produced from the resource. Practically, the input terminal 102 is turned from 0 to 1 a little while after the output terminal 201 has changed from 0 to 1. An output group 202 consists of n output terminals 202-1, 202-2, . . . , and 202-n corresponding to the respective input terminals in the input group 101 in one-to-one correspondence. That is, these n output terminals forming the output group 202 correspond to the n processors $P_1$, $P_2$, . . . , and $P_n$, respectively, and serve to transmit the acknowledgement signal given from the resource via terminal 102 to the processor generating the request and designated by the decision circuit 1 via the corresponding output terminal 202-1, 202-2, . . . , and 202-n. Thus, in the specific example where the signal request from processor $P_1$ is first in priority, when the input terminal 102 has changed from 0 to 1, the control circuit 2 makes reference to the decision output states of the decision circuit 1, and causes only the output terminal 202-1 in the output group 202 corresponding to the processor $P_1$ designated by the decision circuit 1 to be changed from 0 to 1. In this way, the acknowledgement signal sent from the resource is transmitted only to the processor $P_1$. As a result, through the process conducted up to this time, the resource is occupied only by the processor $P_1$. and thereby, the request of the processor $P_1$ is processed. During this period of given time, the processors $P_2$ and $P_3$ producing their requests later in time are kept waiting.

Now, as soon as the request of the processor $P_1$ has been accomplished and the request signal has disappeared resulting in the change from 1 to 0 of the input terminal 101-1 in the input group 101 corresponding to the processor $P_1$, among the decision output terminals of the decision circuit 1, the decision output terminal 1-1' corresponding to the processor $P_1$ changes from 1 to 0, and simultaneously, the decision output terminal 1-2' corresponding to the processor $P_2$ is turned from 0 to 1. On the other hand, the output terminal 201 changes from 1 to 0 following the decision output terminal 1-1' corresponding to the processor $P_1$ among the decision output terminals of the competition decision circuit 1 to inform the resource that the request of the processor $P_1$ has disappeared. However, since the input terminal 102 is still kept 1 at this moment, the output terminal 201 does not follow the signal change of the decision output terminal 1-2' corresponding to the processor $P_2$, but it waits until the input terminal 102 becomes 0. After a little while, when the acknowledgement signal for the processor $P_1$ given from the resource has disappeared, the input terminal 102 is turned to 0, and as a result, the output terminal 201 changes again from 0 to 1 following the processor $P_2$ in a manner similar to the case of the processor $P_1$ to transmit the request signal of the processor $P_2$ to the resource. The subsequent operations are identical to those in the case of the processor $P_1$, and also, the process of operation from the disappearance of the request signal of the processor $P_2$ to the occupation of the resource by the processor $P_3$ is identical.

Consequently, the decision circuit 1 functions in such a manner that not only does it designate the input terminal corresponding to the processor with the earliest request but it also stores and holds the order of the generation of the second and subsequent requests, and that after the first request has disappeared, the order of the generation stored therein is advanced by one and the input terminal corresponding to the processor with the second earliest request is designated.

As is evident from the foregoing, the present asynchronous arbiter is constituted by the competition decision circuit 1 and the control circuit 2 with a sequence logic function in combination. The construction and the operation of the decision circuit 1 will be described more in detail hereunder.

Figure 2:
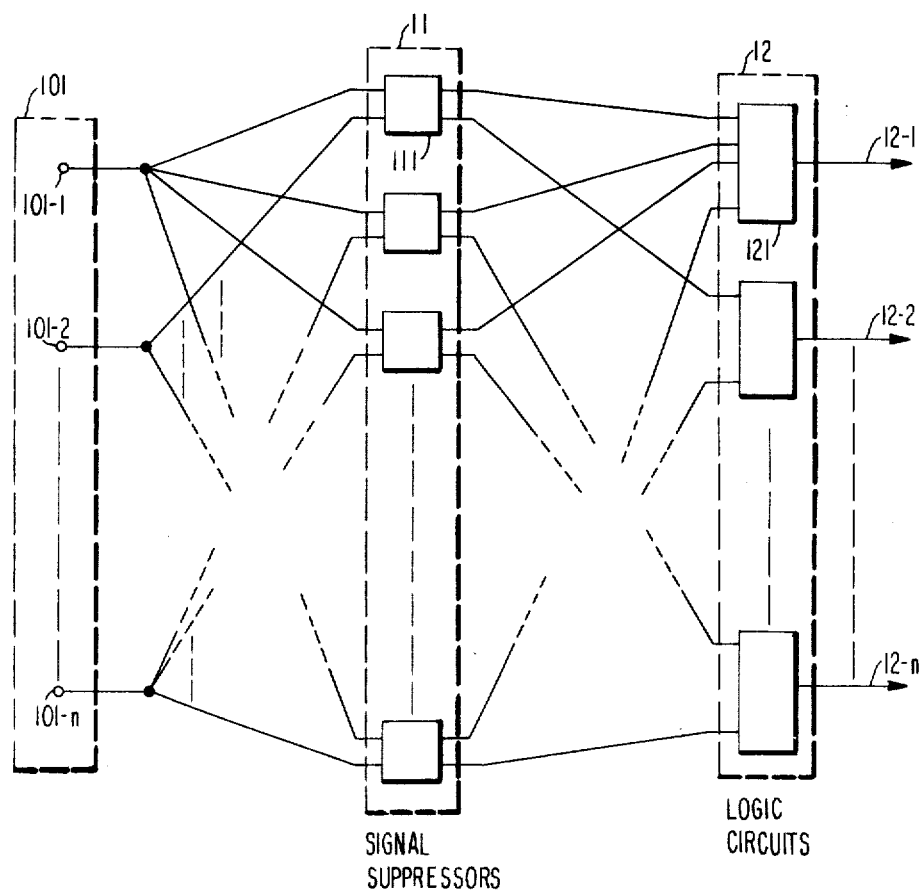
FIG. 2 shows a block diagram for more fully explaining a competition decision circuit 1 of FIG. 1.

In FIG. 2 which shows the construction of the decision circuit 1 of FIG. 1, an elongated block 101 at the left side is the same as the input group 101 of FIG. 1. A first circuit group 11 represented by an elongated block at the center is constructed by one or more signal suppressor circuits 111 each having an identical function. Each signal suppressor circuit 111 in the circuit group 11 has two input terminals and two output terminals corresponding to the input terminals, respectively. When both of the two input terminals are 0, the corresponding two output terminals are both 0, but if either one of the input terminals of the circuit 111 is 1, only the output terminal of the circuit 111 corresponding to the input terminal taking the value 1 is 1. Moreover, if both of the input terminals of the circuit 111 are 1 only the output terminal of the circuit 111 corresponding to the input terminal turned earlier from 0 to 1 changes to 1 and the other remains 0. In other words, the signal suppressor circuit 111 which may be a latch, functions in such a manner that when both of the two input terminals are 1 or either one of the two input terminals is 1, it can be represented by its output state which one of the input terminals was turned earlier from 0 to 1. In addition, immediately upon the one input terminal of the two input terminals of the circuit 111 turned earlier from 0 to 1 returning to 0 again, the corresponding one output terminal of the two output terminals of the circuit 111 also returns to 0, and at this moment, the other output terminal of the two output terminals is 0 or 1 depending on whether the other input terminal of the two input terminals of the circuit 111 is 0 or 1, as a result of the above-mentioned described function. That is to say, this shows that if the winner of the two vying signals returns to 0, the loser with its output terminal suppressed to 0 becomes 1 in place of the earlier winner.

A second circuit group 12 is represented by an elongated block at the right side is composed of a plurality of logic circuits 121 each having a function of producing at its output a logical product of its input logics (an AND-function). The respective logic circuits 121 in the circuit group 12 correspond to the respective input terminals in the input group 101 in one-to-one correspondence, and their output terminals 12-1, 12-2, . . . , and 12-n, respectively, correspond to the n decision output terminals 1-1', 1-2', . . . , and 1-n' of the competition decision circuit 1 and also, serve as the input terminals for the control circuit 2. Each logic circuit 121 has its output terminal turned to 1 only when all of the input terminals connected thereto become 1.

It is to be noted that the number of the signal suppressor circuits 111 forming the first circuit group 11 is equal to that of all the possible combinations of two input terminals selected from the n input terminals of the input group 101, and that the respective signal suppressor circuits 111 have their two input terminals connected to different pairs of input terminals in the input group 101. For instance, in the cases where the input group 101 comprises two, three and four input terminals, the first circuit group 11 consists of one, $$\binom{2}{2} = \frac{2}{2}, \text{three}, \binom{3}{2} = \frac{3 \cdot 2}{2} \text{ and six}, \binom{4}{2} = \frac{4 \cdot 3}{2}$$

signal suppressor circuits 111, respectively. In general, in case of $n$ input terminals, the number of the signal suppressor circuits 111 is equal to $$\binom{n}{2} = \frac{n(n-1)}{2}.$$

Therefore, when the respective input terminals in the input group 101 change from 0 to 1 as when vying with each other, with respect to every possible combination of a pair of the input terminals, it can be indicated by the output states of the respective signal suppressor circuits 111 which one of the two input terminals of each input terminal pair turned earlier from 0 to 1. Now, marking a particular input terminal 101-1 among the input group 101, there are $(n-1)$ different pairs of the input terminals including the particular input terminal 101-1, and also, the number of the signal suppressor circuits 111 with the particular input terminal 101-1 as one of their input terminals is equal to $(n-1)$. Accordingly, the input terminals of the logic circuit 121 in the second circuit group 12 corresponding to the input terminal 101-1 are respectively connected to all the output terminals of these $(n-1)$ signal suppressor circuits 111 at the side corresponding to the input terminal 101-1.

Figure 3:
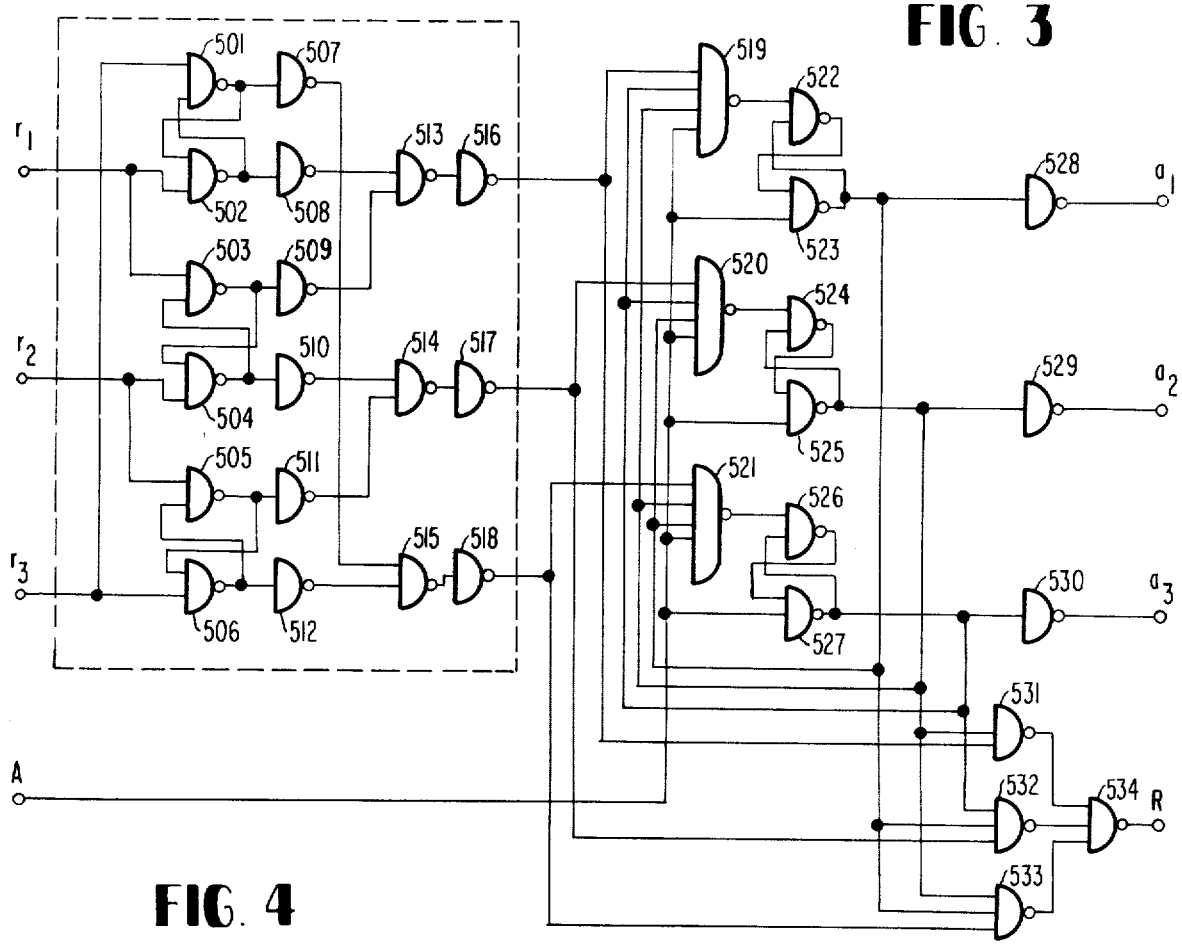
FIG. 3 shows a logic circuit diagram of the embodiment of FIG. 1 more in detail.
Figure 4:
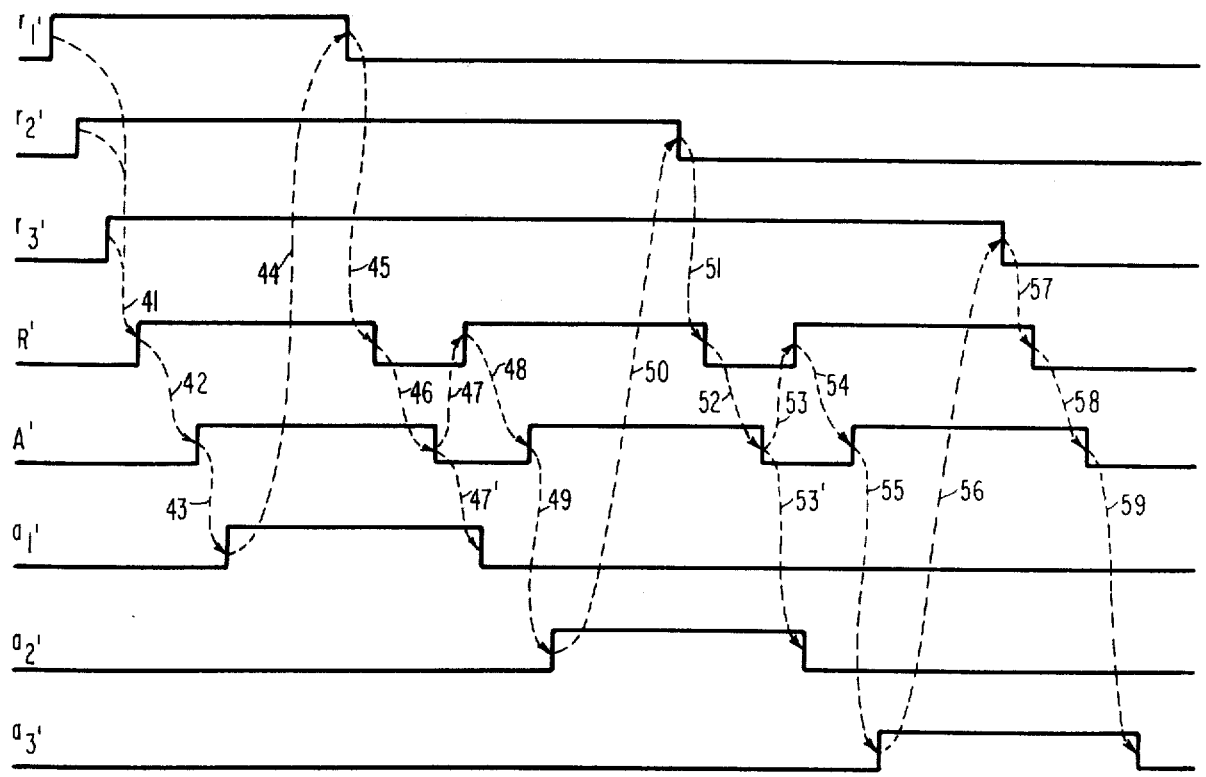
FIG. 4 shows a waveform diagram of signals appearing at the respective input and output terminals in FIG. 3.

In FIG. 3, which shows a logic circuit diagram of the present asynchronous arbiter, the specific construction as shown is embodied only with NAND logic elements for the case where the number of the input terminals of the input group 101 of FIG. 1 is three. Also, FIG. 4 shows a waveform diagram for illustrating the changes with time of the signals appearing at respective input and output terminals in the logic circuit diagram of FIG. 3. In FIG. 3, terminals $r_1$, $r_2$ and $r_3$ are equivalent to three input terminals comprising the input group 101 of FIG. 1, while terminals $a_1$, $a_2$ and $a_3$ are equivalent to three output terminals comprising the output group 202 of FIG. 1. Furthermore, terminals A and R in FIG. 3 correspond to the input terminal 102 and the output terminal 201, respectively, in FIG. 1. In addition, primed reference characters $r_1'$, $r_2'$, $r_3'$, $a_1'$, $a_2'$, $a_3'$, R' and A' in FIG. 4 represent waveforms of the signals respectively appearing at the input and output terminals represented by the same reference characters without primes in FIG. 3. In other words, the primed reference characters $r_1'$, $r_2'$ and $r_3'$ show request signals given from the three processors $P_1$, $P_2$ and $P_3$ (not shown), respectively, which are connected to the input terminals $r_1$, $r_2$ and $r_3$ in the input group 101, the primed reference character R' shows a signal for transmitting a request to the resource (not shown) to be connected to the processors $P_1$, $P_2$ and $P_3$ via the present asynchronous arbiter, the primed reference character A' shows an acknowledgement signal from the resource to any one of the processors $P_1$, $P_2$ and $P_3$ informing the processor that the request is acceptable, and the primed reference characters $a_1'$, $a_2'$ and $a_3'$ show signals for conveying the acknowledgement signal A' to the respective processors $P_1$, $P_2$ and $P_3$.

In FIG. 3, all the reference numerals 501 through 538 represent NAND logic elements, and those encircled by a dashed line correspond to the competition decision circuit 1 of FIG. 1, while the remaining NAND logic elements correspond to the control circuit 2. More particularly, in the decision circuit 1 encircled by the dashed line, three sets of NAND logic elements each consisting of four elements (501, 502, 507, 508), (503, 504, 509, 510) and (505, 506, 511, 512) respectively constitute the signal suppressor circuits 111 in FIG. 2, while three sets of NAND logic elements each consisting of two elements (513, 516), (514, 517) and (515, 518) respectively constitute the logic circuit 121 in FIG. 2.

For the convenience of explanation, it is assumed now that a set of output signal values of a plurality of NAND logic elements are represented by parenthesizing the reference numerals representing said NAND logic elements at the left side of an equation symbol and by parenthesizing the corresponding set of signal values each consisting of either 0 or 1 at the right side of the equation symbol. For instance, in the case where the output of the logic element 501 is 1, the output of the logic element 502 is 0 and the output of the logic element 507 is 0, these output signal values are represented by $(501, 502, 507) = (1, 0, 0)$.

Assuming here that in the initial state all of the input terminals $r_1$, $r_2$, $r_3$ and A and the output terminals $a_1$, $a_2$, $a_3$ and R are 0, the output states of the NAND elements 501 to 506 are as follows:

(501, 502) = (1, 1),
(503, 504) = (1, 1), and
(505, 506) = (1, 1).

Also, it is further assumed that all of the processors $P_1$, $P_2$ and $P_3$ have generated request signals and that the input terminals $r_1$, $r_2$ and $r_3$ have changed from 0 to 1 in that order. Then, in a latch formed of the cross-coupled NAND elements 501 and 502, as a result of the fact that the input terminal $r_1$ has changed from 0 to 1 earlier than the input terminal $r_3$, the output state of (501, 502) = (1, 0) is obtained, and so long as the input terminals $r_1$ and $r_3$ do not change thereafter, this output state is preserved. In a latch formed of the NAND elements 503 and 504 and a latch formed of the NAND elements 505 and 506, similarly the output states of (503, 504) = (0, 1) and (505, 506) = (0, 1) are obtained. Consequently, (507, 508, 509, 510, 511, 512) = (0, 1, 1, 0, 1, 0) can be obtained, and so, the output stae of (513, 514, 515) = (0, 1, 1) is established. Finally, the decision output state of the decision circuit 1 is represented as follows:

(516, 517, 518) = (1, 0, 0).

In other words, only the decision output terminal corresponding to the input terminal $r_1$ which first turned from 0 to 1 among the input terminals $r_1$, $r_2$ and $r_3$, changes to 1, and the other decision output terminals remain 0.

While, in the initial state the respective NAND logic elements in the control circuit 2 take the following output states:

(519, 520, 521) = (1, 1, 1)
(522, 523, 524, 525, 526, 527) = (0, 1, 0, 1, 0, 1),
(528, 529, 530) = (0, 0, 0), and
(531, 532, 533, 534) = (1, 1, 1, 0).

However, as a result of the fact that the decision output state of the decision circuit 1 has changed to (516, 517, 518) = (1, 0, 0) as described above, the output state of the NAND logic elements 531, 532, 533 and 534 changes to:

(531, 532, 533, 534) = (0, 1, 1, 1), and consequently, the output terminal R changes from 0 to 1.

Namely, the earliest request signal among the request signals given from the processors $P_1$, $P_2$ and $P_3$ has been transmitted to the resource via the output terminal R. This operation corresponds to the signal change represented by dashed lines 41 with an arrow mark in the waveform diagram in FIG. 4.

Subsequently, as soon as an acknowledgement signal is generated from the resource for informing the fact that the request signal R' is acceptable, and simultaneously, as soon as the input terminal A is turned from 0 to 1 (this operation represented by a dashed line 42 with an arrow mark in FIG. 4), the respective logic elements of the control circuit 2 take the following output states:

(519, 520, 521) = (0, 1, 1),
(522, 523, 524, 525, 526, 527) = (1, 0, 0, 1, 0, 1), and
(528, 529, 530) = (1, 0, 0).

Thus, the output terminal $a_1$ changes from 0 to 1 (this operation represented by a dashed line 43 in FIG. 4). In other words, the acknowledgement signal is given to only the processor $P_1$, and thereby, the resource is occupied by the processor $P_1$, while the other processors $P_2$ and $P_3$ are compelled to stand by although they are each generating request signals.

Next, when the occupation of the resource by the processor $P_1$ is finished and the request signal given from the processor $P_1$ disappears, the input terminal $r_1$ changes from 1 to 0 (this operation represented by a dashed line 44 in FIG. 4), and the output states of the respecive logic elements in the decision circuit 1 are as follows:

(501, 502, 503, 504, 505, 506) = (0, 1, 1, 0, 0, 1),
(507, 508, 509, 510, 511, 512) = (1, 0, 0, 1, 1, 0).
(513, 514, 515) = (1, 0, 1), and
(516, 517, 518) = (0, 1, 0).

More particularly, as a result of the disappearance of the earliest request signal at the input terminal $r_1$ generated from the processor $P_1$, only the output terminal of the decision circuit 1 corresponding to the input terminal $r_2$ second earliest turned from 0 to 1 becomes 1 and the other output terminals of the decision circuit 1 are 0. Then, since the output terminal of the NAND element 523 is 0 (531, 532, 533, 534) = (1, 1, 1, 0) is established, and thus, the output terminal R changes from 1 to 0 (this operation represented by a dashed line 45 in FIG. 4).

On the resource side, in response to the disappearance of the request signal R', the input terminal A is restored from 1 to 0 to cancel the acknowledgement signal A'(this operation represented by a dashed line 46 in FIG. 4). Consequently, in the control circuit 2, the following output states are obtained:

(519, 520, 521) = (1, 1, 1)
(522, 523, 524, 525, 526, 527) = (0, 1, 0, 1, 0, 1)
(528, 529, 530) = (0, 0, 0), and
(531, 532, 533, 534) = (1, 0, 1, 1).

Thus, simultaneously with the restoration of the output terminal $a_1$ from 1 to 0, the output terminal R again changes from 0 to 1, and thereby, the request signal generated from the processor $P_2$ is transmitted to the resource (these operations represented by dashed lines 47 and 47'). Therefore, when the acknowledgement A' signal is generated from the resource for informing the fact that the request signal R' is acceptable, and thus, the input terminal A again changes from 0 to 1 (this operation represented by a dashed line 48 in FIG. 4), the following output states of the logic elements are obtained in the control circuit 2:

(519, 520, 521) = (1, 0, 1),
(522, 523, 524, 525, 526, 527) = (0, 1, 1, 0, 0, 1), and
(528, 529, 530) = (0, 1, 0). Thus, the output terminal $a_2$ is turned from 0 to 1 (this operation represented by a dashed line 49 in FIG. 4). In this way, the resource has been occupied by the processor $P_2$, and the processor $P_3$ still is kept waiting. Hereinafter, through exactly the same operations as those mentioned above, the occupation of the resource by the processor $P_3$ is acknowledged, and then, instantaneously when the occupation is finished, all the input and output terminals are restored to the same states as their initial states so long as no other processor newly generates a request (these operations represented by dashed lines 50 to 59).

As has been mentioned above, the present invention has been described with reference to one embodiment, the way of allocating the signal values 0 and 1 as exemplified in the illustrated embodiment is not essential to the present invention, and obviously, the method of the allocation of 0 and 1 is arbitrary so long as there is no inconsistency.

In addition, although the invention was described with particular reference to one asynchronous arbiter intervening between processors and a resource in a parallel informaion processing system, the applicable scope of the present invention extends over any aspect where the problems of waiting or competing would occur such as the switching of telephone lines, the page swapping in a virtual memory, the interface control in a computer network and the data bus control in a multi-processor, etc., and the invention can find wide application in computer systems and communication systems.

In summary, the features of the present invention exist in the realization of a very simple hardware capable of processing a plurality of signals in succession by giving the highest preference to the earliest incoming signal and by combining a function of selecting and suppressing a plurality of signals that are asynchronously applied thereto as vying with each other and a function of sequence logic.

It will be apparent from the foregoing description that a number of alternatives and modifications can be made without departing from the spirit and scope of the present invention.

I claim:

1. An asynchronous arbiter comprising:
   a. input means including a plurality of input terminals for receiving asynchronously generated request signals from a plurality of signal sources;
   b. output means including a plurality of output terminals for providing an acknowledgement signal to the highest priority signal source;
   c. another input terminal for receiving an acknowledgement from a resource and another output terminal for providing a request to the resource;
   d. competition decision circuit means connected to said input means having a plurality of decision output terminals equal in number to the input terminals of the input means and having one-to-one correspondence thereto for setting a usual signal value tha is arbitrarily determined among first and second signal values when all of the input terminals of said input means are at said first signal value of a binary signal, while when a part or all of the input terminals of said input means become the second signal value of the binary signal, only one decision output terminal corresponding to the input terminal turned from the first signal value to the second signal value earliest among the input terminals taking the second signal value changes to an unusual signal value difference from the usual value, said competition decision circuit means preserving the order of the occurrence of the changes from the first signal value to the second signal value of the respective input terminals of the input group; wherein said competition decision circuit means comprises:

i. a plurality of signal suppressor circuits equal in number to all the possible combinations of two taken from the number of said plurality of input terminals, each signal suppressor functioning in such a manner that when both of two input terminals of the signal suppressor circuit take a first signal value of a binary signal, both of two output terminals of the signal suppressor circuit corresponding to its respective input terminals are set at usual signal values arbitrarily determined among first and second signal values, while when both or either one of said two input terminals of the signal suppressor circuit take a second signal value, the output terminal of the signal suppressor circuit corresponding to the input terminal turned from the first signal value to the second signal value earlier than the other among the two input terminals of the signal suppressor circuit is turned to an unusual value different from the usual value;

ii. a plurality of logic circuits each producing at its output a logical product of its inputs;

iii. means for connecting said input means to said signal suppressor circuits in such a manner that with regard to an arbitrarily selected pair of the input terminals in said input means the output states of said signal suppressor circuits represent which one of the two input terminals has been turned from the first signal value to the second signal value earlier than the other; and iv. means for connecting the output terminals of the signal suppressor circuits to the input terminals of the plurality of the logic circuits in such a manner that the output states of the plurality of the logic circuits represent which one of the input terminals in said input means has changed earliest from the first signal value to the second signal value; whereby the decision circuit means determines and stores the order of changes in values of the signals so asynchronously applied to said input group means from the plurality of signal sources; and e. control circuit means for generating a request signal at said another output terminal in response to any arbitrary one of the decision output terminals in the decision circuit turned from the usual value to the unusual value, and when an acknowledgement signal at said another input terminal changes in response to the signal change at said another output terminal a signal value at a particular output terminal in the output means determined with reference to the states of the decision output terminals in said decision circuit means changes in accordance with the signal change at said another input terminal whereby among a plurality of signals so asynchronously generated from a plurality of mutually independent binary signal sources as to vie with each other, the signal generated earliest is given the highest preference for transmitting the respective signals in succession to the resource, and the acknowledgement signal from the resource can be returned to the corresponding signal source.

2. An asynchronous arbiter as claimed in clam 1 wherein said signal suppressor circuits are latches comprising cross-coupled NAND logic elements and said logic circuits are comprised of NAND logic circuits.

* * * * *